(12) United States Patent  
Berkcan et al.

(10) Patent No.: US 7,508,189 B2  
(45) Date of Patent: **\*Mar. 24, 2009**

(54) MICRO-ELECTROMECHANICAL SYSTEM (MEMS) BASED CURRENT AND MAGNETIC FIELD SENSOR HAVING IMPROVED SENSITIVITIES

(75) Inventors: Ertugrul Berkcan, Clifton Park, NY (US); Shankar Chandrasekaran, Tamil Nadu (IN); Christopher James Kapusta, Delanson, NY (US); Laura Jean Meyer, Schenectady, NY (US); Glenn Scott Claydon, Wynantskill, NY (US); Debbie Gahaton Jones, Berkeley, CA (US); Anis Zribi, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 55 days.

This patent is subject to a terminal disclaimer.

(21) Appl. No.: 11/733,896

(22) Filed: Apr. 11, 2007

(65) Prior Publication Data

US 2008/0122431 A1    May 29, 2008

Related U.S. Application Data

(63) Continuation of application No. 11/289,910, filed on Nov. 30, 2005, now Pat. No. 7,221,144, which is a continuation-in-part of application No. 11/129,682, filed on May 13, 2005, now Pat. No. 7,315,161, which is a continuation-in-part of application No. 10/863,442, filed on Jun. 7, 2004, now Pat. No. 7,112,951.

(51) Int. Cl.  
    *G01R 31/00*    (2006.01)

(52) U.S. Cl. .................................. 324/126; 327/117 R

(58) Field of Classification Search .................. None  
See application file for complete search history.

(56) References Cited

U.S. PATENT DOCUMENTS

| 5,952,819 | A | 9/1999 | Berkcan et al. |
| 6,348,788 | B1 | 2/2002 | Yao et al. |
| 6,384,353 | B1 | 5/2002 | Huang et al. |
| 6,664,786 | B2 | 12/2003 | Kretschmann et al. |
| 6,690,178 | B2 | 2/2004 | Harris et al. |

(Continued)

FOREIGN PATENT DOCUMENTS

EP    1306678 B1    5/2003

(Continued)

OTHER PUBLICATIONS

Pending U.S. Appl. No. 10/854,845, filed May 27, 2004.

*Primary Examiner*—Minh N Tang  
(74) *Attorney, Agent, or Firm*—Paul J. DiConza

(57) ABSTRACT

A micro-electromechanical system current and magnetic field sensor is presented. The micro-electromechanical system current and magnetic field sensor is configured to sense a magnetic field produced by a current carrying conductor. The sensor includes a structural component comprising a substrate and a compliant layer, a magnetic-to-mechanical converter coupled to the structural component to provide a mechanical indication of the magnetic field. The sensor further includes a strain responsive component coupled to the structural component to sense the mechanical indication and to provide an indication of the current in the current carrying conductor in response thereto.

22 Claims, 12 Drawing Sheets

U.S. PATENT DOCUMENTS

| | | |
|---|---|---|
| 6,734,660 B1 | 5/2004 | Berkcan et al. |
| 7,221,144 B2 * | 5/2007 | Berkcan et al. ............ 324/126 |
| 2002/0021122 A1 | 2/2002 | Yao et al. |
| 2002/0158040 A1 | 10/2002 | Lucak et al. |
| 2004/0158439 A1 | 8/2004 | Kim et al. |

FOREIGN PATENT DOCUMENTS

| | | |
|---|---|---|
| EP | 1006365 B1 | 6/2003 |
| WO | 03012459 A1 | 2/2003 |

* cited by examiner

MICRO-ELECTROMECHANICAL SYSTEM (MEMS) BASED CURRENT AND MAGNETIC FIELD SENSOR HAVING IMPROVED SENSITIVITIES

CROSS-REFERENCE TO RELATED APPLICATIONS

This Application is a CONTINUATION of U.S. patent application Ser. No. 11/289,910, filed Nov. 30, 2005, now U.S. Pat. No. 7,221,144 entitled "Micro-Electromechanical System (MEMS) based Current and Magnetic Field Sensor Having Improved Sensitivities", which is a continuation-in-part of U.S. patent application Ser. No. 11/129,682 filed May 13, 2005, now U.S. Pat. No. 7,315,161 entitled "MICRO-ELECTROMECHANICAL SYSTEM (MEMS) BASED CURRENT & MAGNETIC FIELD SENSOR HAVING CAPACITIVE SENSE COMPONENTS", which in turn is a continuation-in-part of U.S. patent application Ser. No. 10/863,442 filed Jun. 7, 2004, now U.S. Pat. No. 7,112,951 entitled "MEMS BASED CURRENT SENSOR USING MAGNETIC-TO-MECHANICAL CONVERSION AND REFERENCE COMPONENTS", all of which are hereby fully incorporated by reference.

BACKGROUND

The present disclosure relates generally to electrical current and magnetic field sensing devices. More particularly, the present disclosure relates to a micro-electromechanical system (MEMS) based current and magnetic field sensor.

It is known that a current carrying conductor produces a magnetic field in the vicinity of the current carrying conductor. It is also known that the magnetic field produced by the current carrying conductor can induce a force with another current carrying conductor disposed in the magnetic field produced by that current carrying conductor. As such, one approach used to sense electrical current involves the use of a sensor that measures the magnetic field induced by current flowing in a current carrying conductor. Since the generated magnetic field is proportional to the current flowing in the current carrying conductor, such a sensor can use the magnitude of the magnetic field to determine the current.

Current sensors that use magnetic fields to measure electrical current are well suited for high voltage applications from a safety perspective because they do not have to contact the high voltage circuitry. However, there are several disadvantages associated with existing current sensors that use magnetic fields to measure electrical current in high voltage applications. In general, existing current sensors tend to have a large form factor because they require a thick conductor that can withstand the varying levels of current flow that may be experienced. This current flow induces heating, which reduces the efficiency of the current sensors and introduces a possible error factor in sensor accuracy. Since existing current sensors are large and bulky, their physical and electrical operating characteristics have up to now prevented their use in smaller scale environments. Moreover, existing current sensors do not provide the required levels of sensitivity needed to operate in such small scale environments.

BRIEF DESCRIPTION

In accordance with one aspect of the disclosure a micro-electromechanical system (MEMS) current and magnetic field sensor for sensing a magnetic field produced by a current carrying conductor is provided. The MEMS current and magnetic field sensor includes a structural component comprising a silicon substrate, and a compliant layer comprising a material selected from the group consisting of silicon dioxide and silicon nitride. The sensor further includes a magnetic-to-mechanical converter coupled to the structural component to provide a mechanical indication of the magnetic field, and a strain responsive component coupled to the structural component to sense the mechanical indication and to provide an indication of the current in the current carrying conductor in response thereto.

In accordance with another aspect of the disclosure, a method for fabricating a MEMS magnetic field sensing component is described. The method includes providing a substrate including a compliant layer comprising a material selected from the group consisting of silicon dioxide and silicon nitride. The method further includes forming a strain responsive component on the substrate, forming a magnetic-to-mechanical converter on the substrate, and removing at least a portion of the substrate to release a spring element formed at least partly by the compliant layer.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In the following detailed description, numerous specific details are set forth in order to provide a thorough understanding of various embodiments of the present invention. However, those skilled in the art will understand that embodiments of the present invention may be practiced without these specific details, that the present invention is not limited to the depicted embodiments, and that the present invention may be practiced in a variety of alternative embodiments. In other instances, well known methods, procedures, and components have not been described in detail.

Furthermore, various operations may be described as multiple discrete steps performed in a manner that is helpful for understanding embodiments of the present invention. However, the order of description should not be construed as to imply that these operations need be performed in the order they are presented, nor that they are even order dependent. Moreover, repeated usage of the phrase "in one embodiment" does not necessarily refer to the same embodiment, although it may. Lastly, the terms "comprising", "including", "having", and the like, as used in the present application, are intended to be synonymous unless otherwise indicated.

Figure 1:
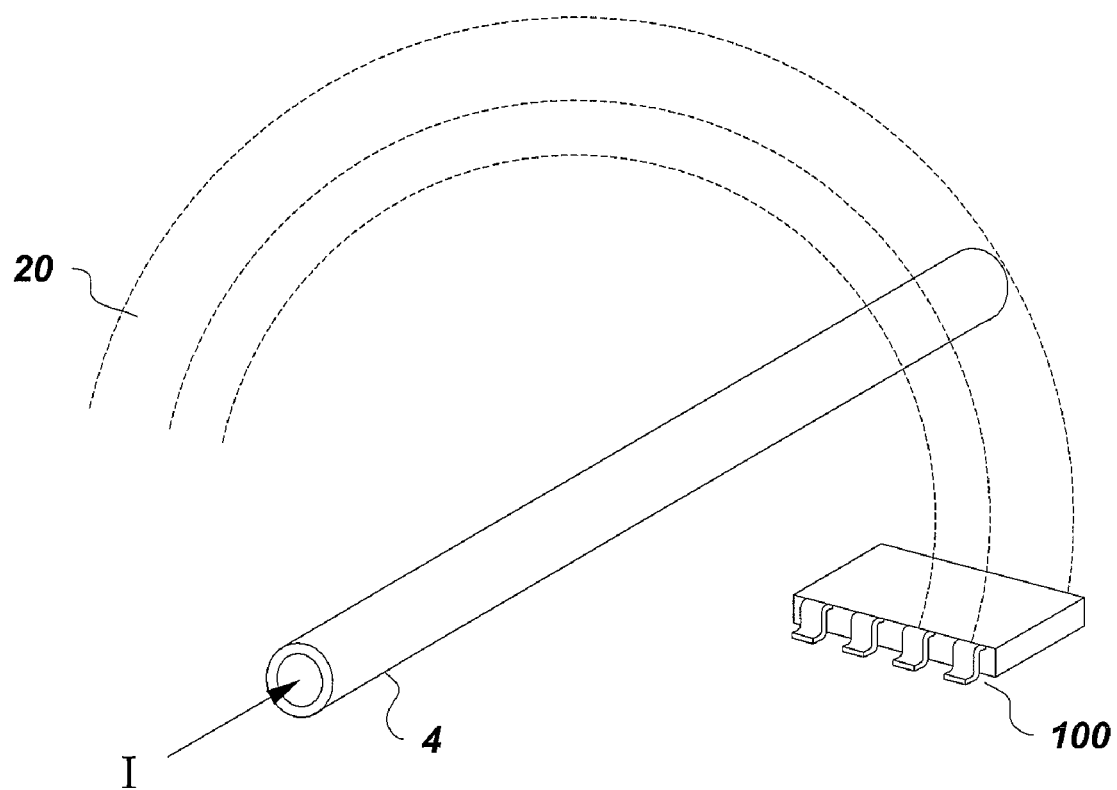
FIG. 1 is a schematic diagram representative of a MEMS-based current and magnetic field sensing device constructed in accordance with various embodiments of the invention.

FIG. 1 illustrates one embodiment of a MEMS current and magnetic field sensing device described herein and hereinafter generally referred to as a "current sensor" or "MEMS current sensor". As shown, the conductor 4 carrying a current I generates a magnetic field 20. In accordance with one embodiment of the present disclosure, the current sensor 100 can be used to sense the current I in a current carrying conductor 4, without having to make physical contact with the current carrying conductor. In accordance with the illustrated embodiment, the current sensor 100 operates to sense and determine the current I carried by the conductor 4 by making use of the Lorentz force resulting when the current sensor 100 is positioned in the magnetic field 20 generated by current I. In one embodiment, the current sensor 100 includes a magnetic field sensing component for sensing magnetic fields and for providing, in response thereto, an indication of the current present in the respective conductors to be measured.

The advantageous size of a MEMS-based current and magnetic field sensor, such as the current sensor 100 described herein, facilitates the sensing of current in applications where space is limited. Moreover, the use of MEMS-based components in a current sensor provides a current sensor that is highly accurate, reliable, robust, and introduces little to no error to the current being sensed. Due, at least in part, to the non-contact sensing methods described herein for sensing current using a MEMS current sensor, the MEMS current sensor preferably has no impact on the magnitude and/or direction of the current being sensed. For example, given the dimensions of MEMS-based components and the sensitivity of the same, the MEMS current sensor preferably does not introduce or cause any appreciable variation or change in the current being sensed or measured. Moreover, the MEMS current sensor is advantageous for its reduced cost and significantly reduced size over existing current sensors. Further, due to micro-lithography and micro-fabrication techniques, the fabrication of the MEMS current sensor is advantaged through increased accuracy and precision.

Figure 2:
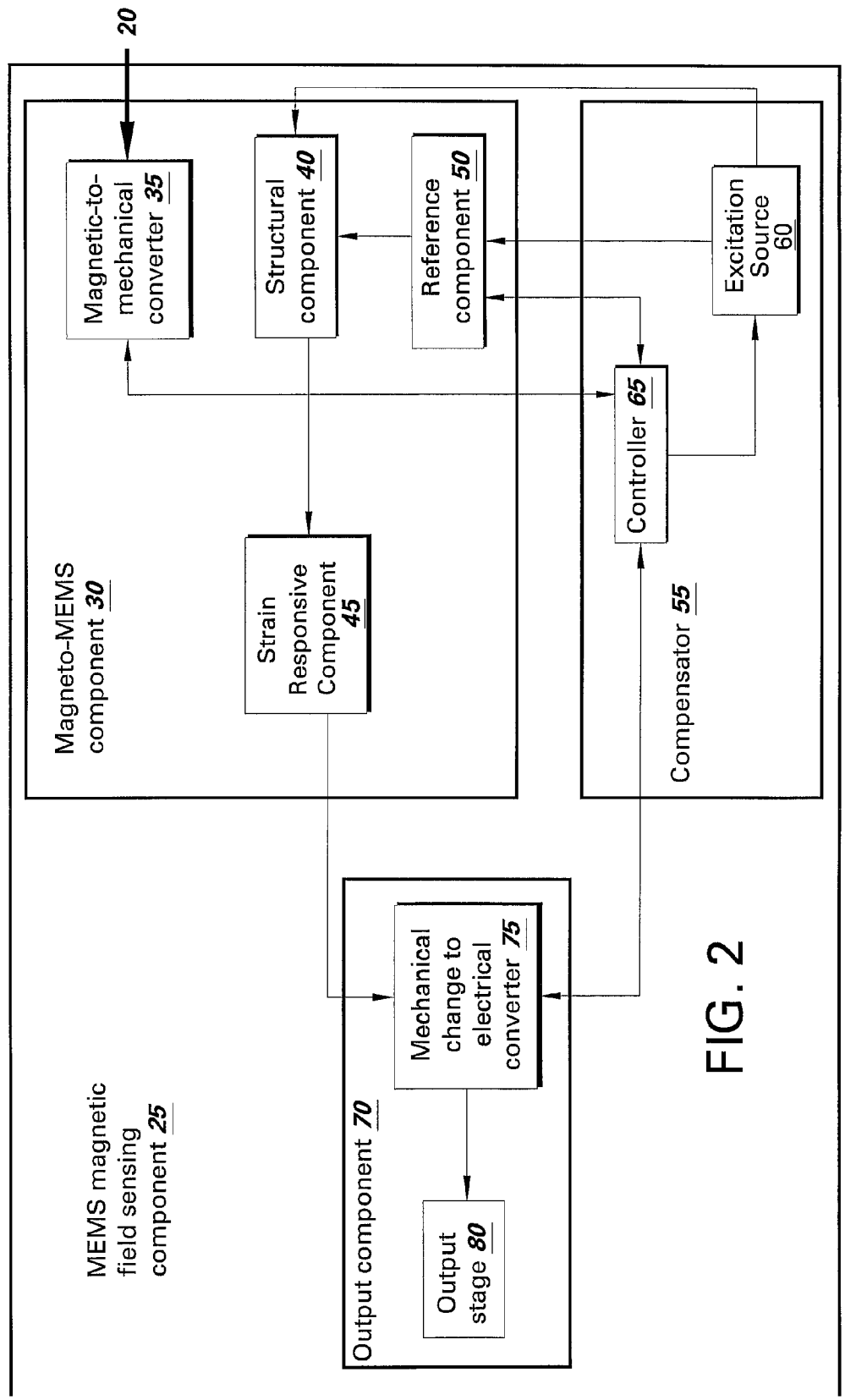
FIG. 2 is a schematic diagram illustrating one embodiment of a MEMS-based magnetic field sensing component of a MEMS-based current sensor.

FIG. 2 is a schematic diagram illustrating one embodiment of a MEMS-based magnetic field sensing component 25 of a MEMS-based current sensor such as MEMS-based current sensor 100. In accordance with one embodiment of the present invention, the MEMS-based magnetic field sensing component 25 senses magnetic fields such as magnetic field 20 and provides an indication of the current in a corresponding current carrying conductor, such as conductor 4. The sensed indication of the current may include both a magnitude and a directional component of the current being sensed. In one embodiment, the sensed indication of the current may be an electrical indication of the current being sensed whereas in other embodiments, the sensed indication may be a mechanical indication.

In the illustrated embodiment of FIG. 2, the MEMS-based magnetic field sensing component 25 includes a magneto-MEMS component 30, a compensator 55 and an output component 70. In one embodiment, the magneto-MEMS component 30 may sense a magnetic field and, in response thereto, convert the sensed magnetic field to a mechanical indicator of a corresponding current I. In one embodiment, the output component 70 may provide an output indicative of the current I in the conductor being measured. In one embodiment, output from the output component 70 may take the form of an electrical signal indicative and representative of the magnitude and sign of the current flowing in the conductor being measured.

In accordance with the illustrated embodiment, the magneto-MEMS component may 30 include a magnetic-to-mechanical converter 35 for converting the magnetic representation of the current I to a mechanical change. In one embodiment, the magnetic-to-mechanical converter 35 may be a conductor such as a metal (e.g., gold (Au) and aluminum (Al)) or another electrically conductive material such as polysilicon. Additionally, the magneto-MEMS component 30 may include a structural component 40 for providing structural support to magneto-MEMS component 30. The structural component 40 may represent one or more heterogeneous or homogeneous structures, devices, materials, assemblies, sub-systems, elements and so forth. For example, the structural component 40 may include a substrate and one or more spring elements such as but not limited to a deflectable membrane, diaphragm, cantilever, flexure member, torsion element or any number of other elements. In one embodiment of the present invention, the substrate may include a silicon substrate and a low stress silicon region. In one embodiment, the low stress silicon region may include a silicon containing layer having a residual stress of about 50-100 Mega pascals (MPa). In one embodiment, the low stress silicon region may include a low stress silicon nitride layer or film deposited on the silicon substrate.

In one embodiment, the structural component 40 may be responsive to the mechanical change provided by the magnetic-to-mechanical converter 35 and the structural component 40 may provide a mechanical indicator representative of the current I. In one embodiment, the mechanical indicator may be a force or stress induced on one or more elements of the structural component 40. The induced force or stress may in turn cause a movement such as a deflection or displacement in a spring element of the structural component 40. In one embodiment, the structural component 40 may be configured to register a bending or a concurrent bending and twisting action experienced by the structural component 40 responsive to the mechanical indication from the magnetic-to-mechanical converter 35.

In yet another embodiment, the mechanical indicator may include modification of a mechanical property of the structural component 40, such as, for example, a spring constant and the mass thereof. Moreover, the mechanical indicator provided by the structural component 40 may convey the vector space value of the mechanical indicator, including one or more of an associated amplitude, direction, speed, and any other characteristic thereof that can be used to convey the vector space value of the mechanical indicator. In one embodiment, the magneto-MEMS component 30 further includes a strain responsive component 45 which functions as a mechanical sense component for sensing the mechanical indicator provided by the structural component 40. In one embodiment, the strain responsive component 45 may convert the mechanical indicator or change imparted to the structural component 40 into a strain. In one embodiment, the strain responsive component 45 may include a piezo-resistive element, which exhibits a change in resistive properties responsive to the mechanical indicator. In turn, the change in resistance may be converted to interface signal (e.g., by the output component 70) representative of the sensed current I. For example, the amount of stress placed on the piezo resistor may be proportional to the amount of deflection experienced by one or more corresponding spring elements and the magnitude of the current flowing in the magnetic-to-mechanical converter 35.

In one embodiment, the strain-to-electrical converter 75 converts the sensed mechanical indicator to a form that may be interpreted and/or further processed by the output stage 80. Output stage 80 may interface with a memory, an indicator (e.g., a display screen), and/or another device or apparatus (e.g., a digital signal processor or computer-based analyzer) for additional processing of the signal(s) or indicators received from the strain-to-electrical converter 75.

The strain-to-electrical converter 75 may be designed based on the nature of the strain responsive component. In one embodiment, the strain-to-electrical converter 75 may be based on a piezo resistive element, however in other embodiments the strain-to-electrical converter 75 may be based on, for example, a metal strain element, a piezoelectric element, a tunneling element, a capacitive element, or an optical element. In one embodiment, the strain-to-electrical converter 75 may include a resistive Wheatstone bridge or a capacitive bridge. In certain embodiments, the functions of the strain responsive component 45 and the strain-to-electrical converter 75 may be performed by a single device or material.

Additionally, compensator 55 may be used to compensate for effects due to e.g., aging of the sensor, temperature, environmental factors, etc. The compensator 55 may include an excitation source 60 (such as a current source) and a controller 65. The excitation source 60 may provide excitation quanta (i.e., an amount of excitation energy) for use by the MEMS magnetic field sensing component 25. The controller 65 may control, for example, a switching and an application of the excitation quanta of the excitation source 60 and the reference signal of the reference component 50. In one embodiment, reference component 50 may provide a reference indicator for the mechanical indication to the structural component 40. The controller 65 may be, for example, a switch, an analog processor, a digital signal processor, a digital computing device or an analog-computing device. In the present example, the controller controls at least an on, off, and a value of a bias current supplied to the magnetic-to-mechanical converter 35. In another embodiment, the controller may select between differing values of the excitation quanta and a plurality of reference components 50. Such reference components may be included for enhancing a function of the MEMS current sensor. For example, a switch may be included for activating, processing, and controlling logic functions associated with the MEMS current sensor.

In the illustrated embodiment, a magnetic-to-mechanical converter 35 is coupled to the structural component 40 such that when the magneto-MEMS component 30 is placed in the vicinity of an external current carrying conductor, and a small bias current is flowed in the magnetic-to-mechanical converter 35, the magnetic field generated by the external conductor will exert a force (e.g., Lorentz force) on the magnetic-to-mechanical converter 35. The bias current used may be in the range of micro-amps (µA) or milliamps (mA) however a typical bias current might be 1-10 mA. Moreover, a DC or AC bias current may be used without modification to the magneto-MEMS component 30. Moreover, by driving an AC bias current at frequency that coincides with the resonant frequency of the device, it is possible to further increase sensitivity of the device.

While discussed primarily in the context of using the Lorentz force between the first and second sense components, the magnetic-to-mechanical converter 35 can be modified to use mutual inductance, a moving loop and a magnetic field generated by an external current carrying conductor. Additionally, other characteristic relationships may be used to derive a mechanical indicator of the mechanical indicator corresponding to the current being sensed.

Due to batch manufacturing techniques of micro-machining and the associated cost efficiencies, the MEMS magnetic field sensing component and associated MEMS-based current sensor as described herein can be manufactured in large batches using for example, photolithography and etching. As noted above, the MEMS device of FIG. 2 is but one example of a current sensor contemplated in accordance with the present disclosure. Other embodiments of a MEMS-based current sensor of the present invention may include the use of multiple MEMS devices in the current sensor for the purpose of, for example, magnetic field shaping, magnetic field sensing, current value indicating, and other purposes. Moreover, the description of the components illustrated in FIG. 2 is intended to be illustrative of one embodiment of a MEMS magnetic field sensing component 25. To that end, although the output component 70, the magneto-MEMS component 30 and the compensator 55 of FIG. 2 appear as separate components, these components and their respective functions may be further combined or further partitioned without departing from the spirit and scope of the disclosure.

Figure 3:
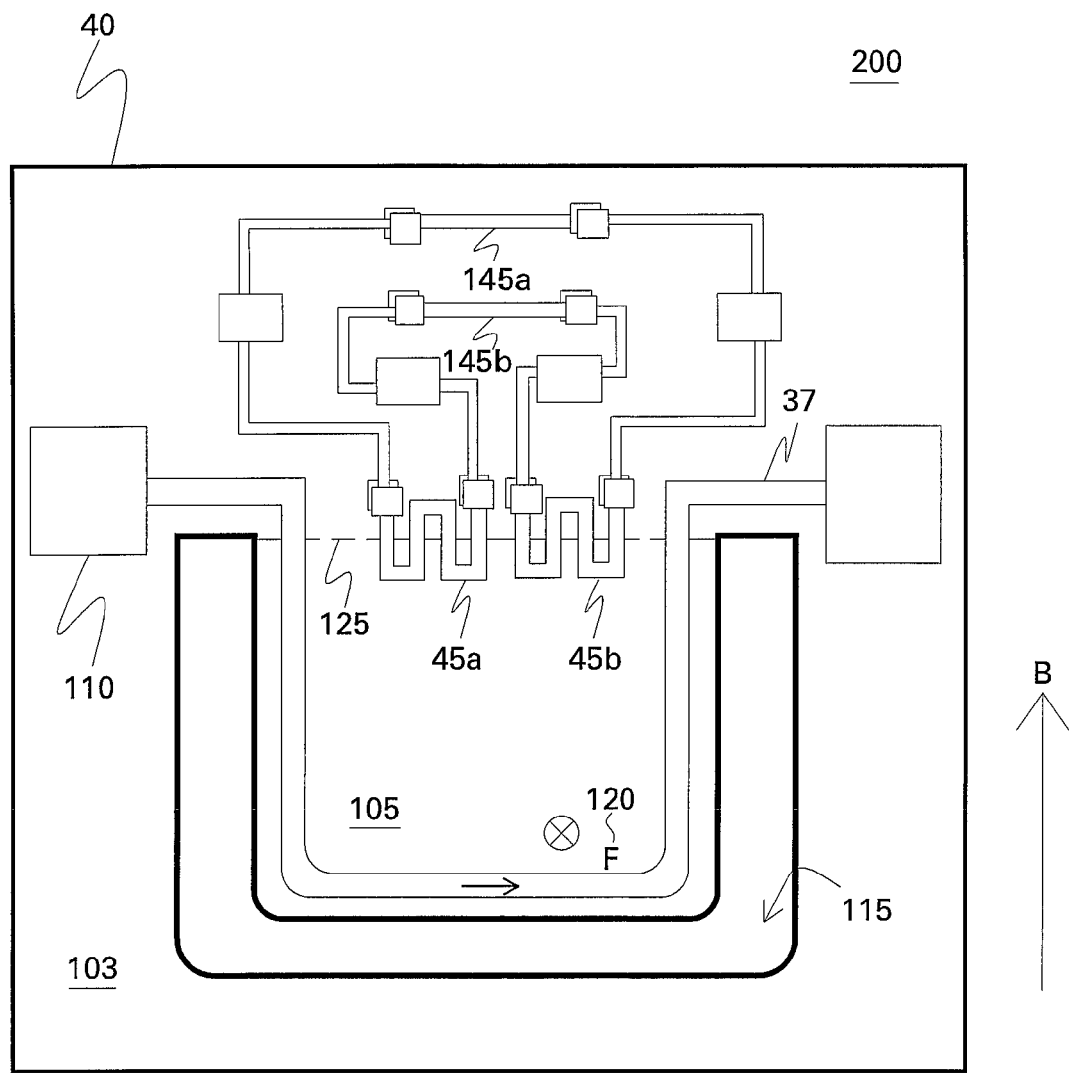
FIG. 3 illustrates one embodiment of a MEMS magnetic field sensing component having a cantilever design.

FIG. 3 illustrates one embodiment of a MEMS magnetic field sensing component having a cantilever design. As illustrated in FIG. 3, MEMS magnetic field sensing component 200 includes a structural component 40 and a magnetic-to-mechanical converter in the form of a conductor 37. The structural component 40 includes a substrate portion 103 and a spring element in the form of a cantilever plate 105. The cantilever plate 105 has been released from the bulk of the substrate 103 along three edges and is supported by a single edge as shown. Accordingly, the cantilever plate 105 may tend to deflect about strain line 125 at the unsupported end in an upward or downward direction perpendicular to the plane of the substrate. In other embodiments, a spring element such as a membrane may be used in place of a cantilever design. Since a membrane would likely be attached to the substrate 103 on four sides, four corresponding strain lines would likely develop.

In one embodiment, the conductor 37 may be coupled to the structural component 40 to receive a small bias current ($I_{BIAS}$) as shown. The conductor 37 may be anchored to the structural component 40 by supports 110 and may be routed in various patterns across and around the cantilever plate embodiment where the magnetic-to-mechanical converter is a conductor (such as the conductor 37 of FIG. 3), the magnetic field sensitivity of the current sensor can be increased depending upon the routing pattern chosen for the conductor. For example, in FIG. 3 although the conductor 37 is illustrated as a single trace routed along the periphery of the cantilever plate 105, the conductor 37 may instead include multiple traces routed across the cantilever plate 105 or may be formed into a coil. In one embodiment, nested or coiled conductor traces may be arranged such that the bias current $I_{BIAS}$ is caused to flow in the same direction across the cantilever plate 105 acting additively to effectively enhance the response of the cantilever plate 105 due to the Lorentz force 120.

Based at least in part upon the illustrated configuration, when the MEMS magnetic field sensing component 200 is placed in a magnetic field B, the cantilever plate 105 acting as a spring element is deflected at the end unsupported by the substrate 103 by an amount that is proportional to the magnetic field and by extension, the current being sensed. This is due to the mechanical indication in the form of a Lorentz force 120 generated by the conductor 37 in response to the interaction of the bias current $I_{BIAS}$ and the magnetic field. In the illustrated embodiment, the cantilever plate 105 may be deflected down into the cavity 115 (formed through e.g., the controlled etching of the bulk substrate 103 as described in further detail below) above which the cantilever plate 105 has been suspended. As the cantilever plate 105 deflects, it experiences a bending force and a resulting strain in the cantilever plate 105 where it joins the substrate 103 as generally indicated by strain line 125.

In accordance with one embodiment of the present invention, MEMS magnetic field sensing component 200 is further equipped with strain responsive components 45a and 45b coupled to the structural component 40 so as to sense the strain generated due to the bending of the cantilever plate 105. In one embodiment, the strain responsive components 45a and 45b may represent piezo-resistive elements that are positioned at a location that is coincident with the largest strain experienced by the structural component. For example, in the illustrated embodiment the strain responsive components 45a and 45b are positioned partially on the substrate 103 and partially on the cantilever plate 105 across the strain line 125. In the illustrated embodiment, the strain responsive components 45a and 45b are arranged in a serpentine fashion where multiple 'legs' or sections of the strain responsive components cross the strain line 125. However, in other embodiments the strain responsive components 45a and 45b may take on other geometric configurations without departing from the spirit and scope of the invention. As will be described in further detail below, one or more strain concentrators may be employed to focus the resulting strain to a more localized area thereby enhancing the sensitivity of the magnetic field sensing component.

Figure 12:
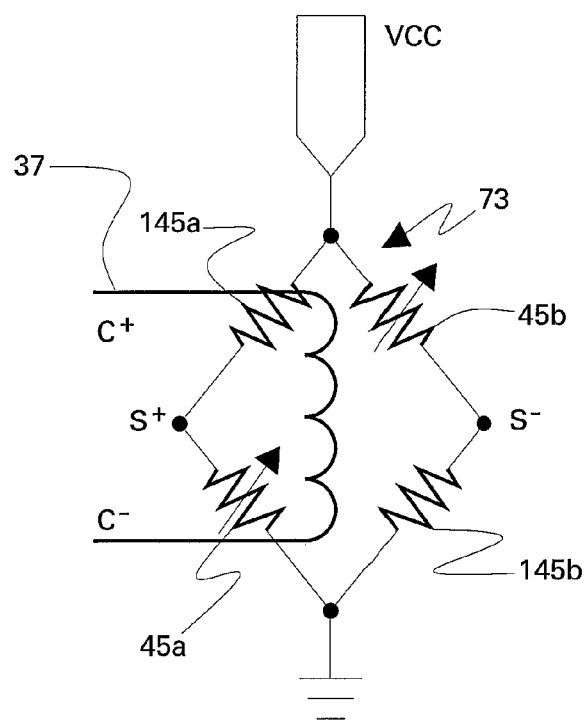
FIG. 12 illustrates a resistive bridge suitable for use with the MEMS magnetic field sensing component in accordance with one embodiment.

In accordance with one embodiment of the present invention, the strain responsive components 45a and 45b may be coupled in a resistive bridge arrangement along with balancing resistors 145a and 145b. For example, FIG. 12 illustrates a resistive bridge suitable for use with the MEMS magnetic field sensing component in accordance with one embodiment. In particular, with reference to FIG. 12, the bridge 73 includes strain responsive components 45a and 45b coupled between balancing resistors 145a and 145b as shown. As a bias current (e.g., $I_{BIAS}$) is applied to conductor 37 and the corresponding MEMS field sensing component is positioned within a magnetic field, one or more characteristics of strain responsive components 45a and 45b may change. For example, piezo resistive strain responsive components might experience a change in resistivity which can be detected at the S+ and S− locations.

Figure 4:
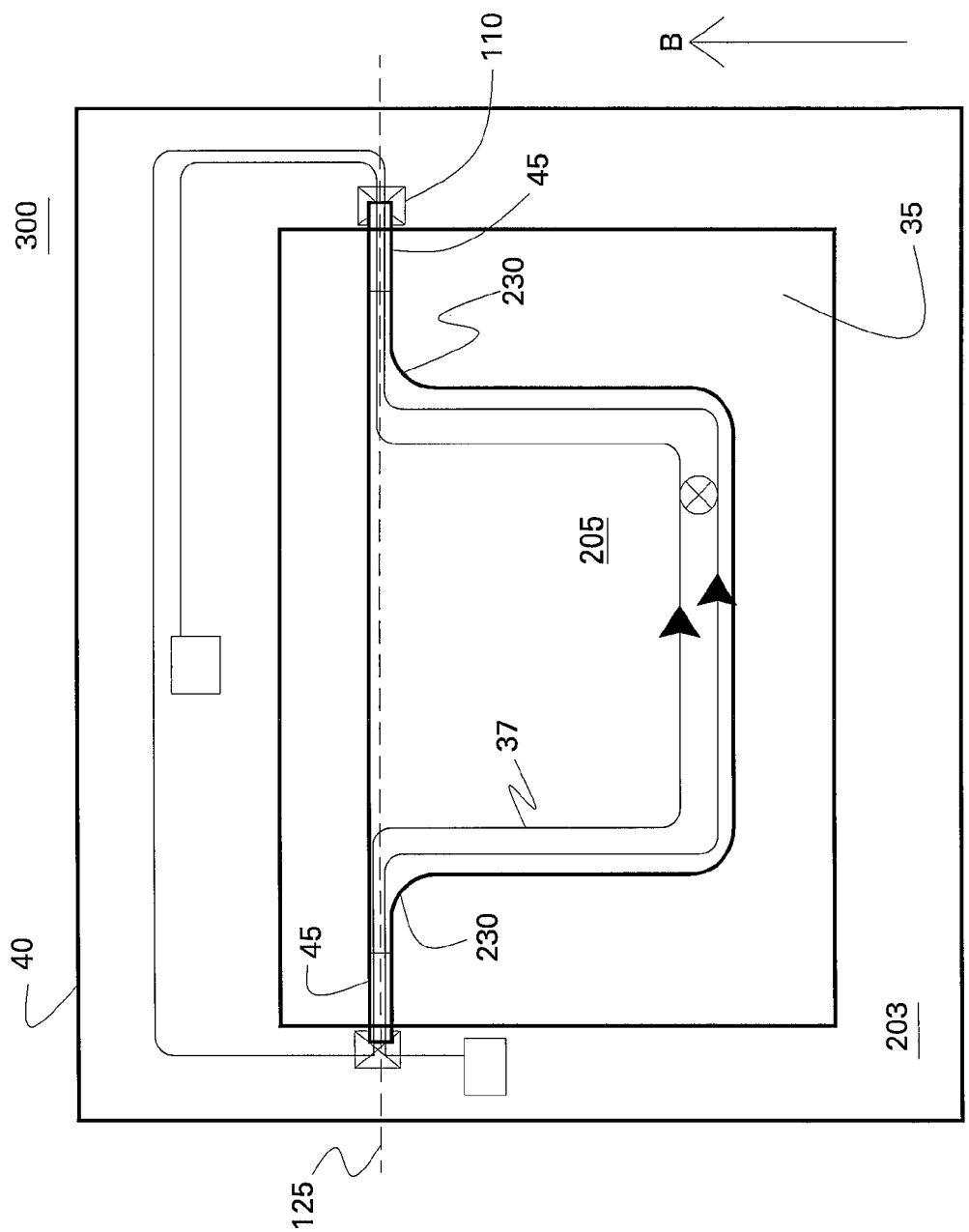
FIG. 4 illustrates an example MEMS magnetic field sensing component including a half-torsion cantilever design in accordance with one embodiment of the present invention.

FIG. 4 illustrates an example MEMS magnetic field sensing component including a half-torsion cantilever design in accordance with one embodiment of the present invention. As illustrated in FIG. 4, MEMS magnetic field sensing component 300 includes a structural component 40 further including a substrate 203 and a cavity 115 defined therein. Cavity 115 may be formed in a number of ways including by etching through the backside of the substrate 203. A dry etching process such as deep reactive ion etching or a wet etching process such as a KOH etching may be used. In one embodiment, an anisotropic etching process may be used such that the walls that define the cavity 115 within the substrate 203 are formed at fixed and/or substantially reproducible angles.

The MEMS magnetic field sensing component 300 further includes a cantilever plate 205 that is positioned above the cavity 115 as shown. The cantilever plate 205 is similar in form to the cantilever plate 105 of FIG. 3, however cantilever plate 205 includes the addition of torsion elements 230. In the illustrated embodiment, the cantilever plate 205 is coupled to the structural component 40 at the supports 110 by way of the torsion elements 230. More specifically, in contrast to the cantilever plate 105 of FIG. 3, the cantilever plate 205 is additionally released from the substrate 203 along the back edge 207 of the plate. Accordingly, as the MEMS magnetic field sensing component 300 is exposed to a magnetic field and a small bias current ($I_{BIAS}$) is applied to the conductor 37, the cantilever plate 205 may be deflected downward into the cavity 115 (or alternatively upward away from the cavity 115) about the torsion elements 230.

As the cantilever plate 205 is deflected, a bending as well as a twisting force or torsion occurs in the torsion elements 230 e.g., along the strain line 125. In accordance with the illustrated embodiment of the invention, strain responsive components 45 in the form of piezo-resistive elements may be coupled to the torsion elements 230 to sense such bending and twisting. In one embodiment, the piezo-resistive elements may be positioned such that their location coincides with those portions of torsion elements 230 that experience the largest torsional stress. The stress is then transferred to the piezo-resistive elements causing the piezo-resistive elements to exhibit a change in their resistive characteristics. This 'sensed' stress may then be converted into an electrical signal (e.g., by strain-to-electrical converter 75), which is in turn provided to the output stage 80. In one embodiment, the strain-to-electrical converter function may be performed at least in part by the piezo-resistive element(s) used to sense the mechanical change or stress experienced by the structural component 40.

Figure 5:
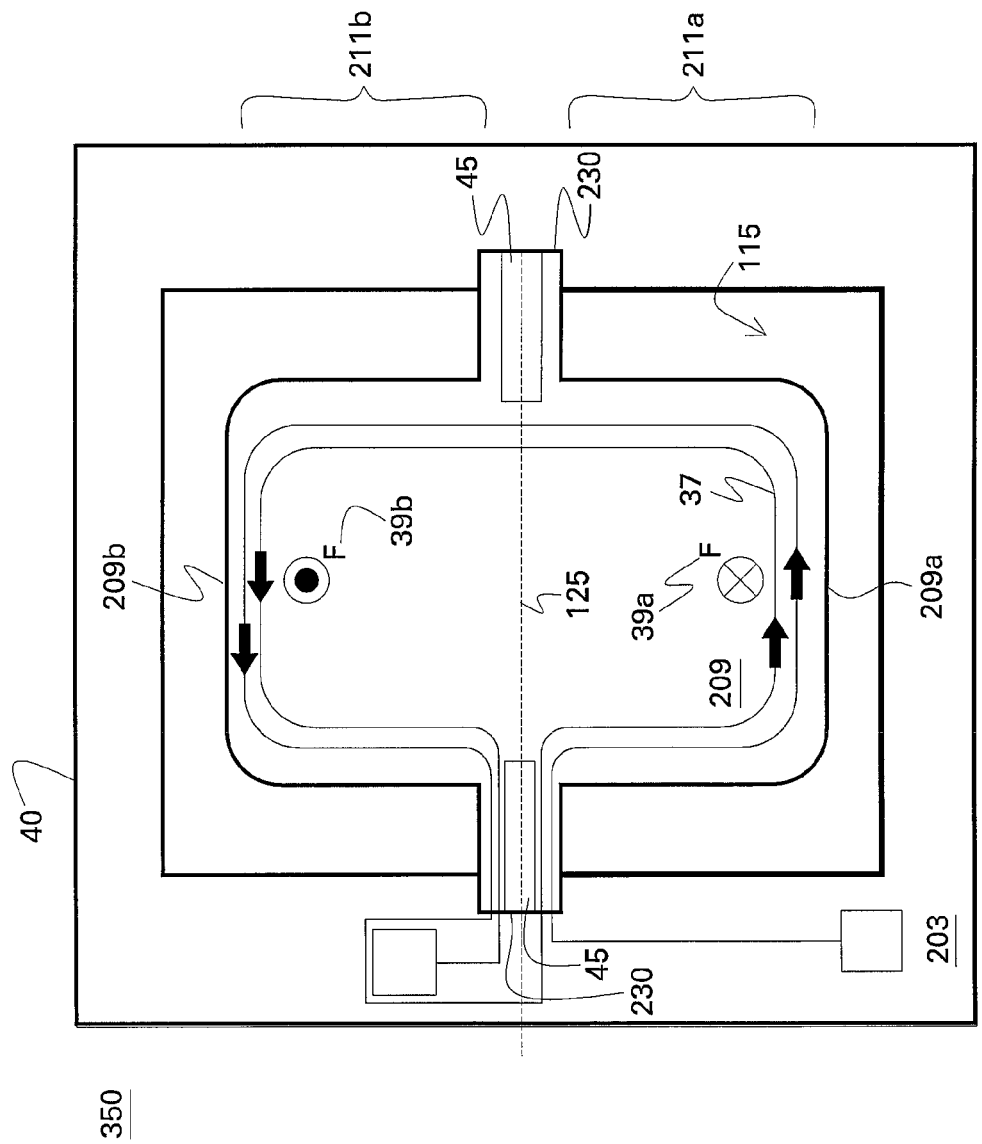
FIG. 5 illustrates an example MEMS magnetic field sensing component including a full-torsion cantilever design in accordance with another embodiment of the invention.

FIG. 5 illustrates an example MEMS magnetic field sensing component including a full-torsion cantilever design in accordance with another embodiment of the invention. As with MEMS magnetic field sensing component 300 of FIG. 4, the illustrated MEMS magnetic field sensing component 350 includes both a structural component 40 further including a substrate 203 and a cavity 115 defined therein. Although the MEMS magnetic field sensing component 350 includes a cantilever plate 209, the cantilever plate 209 is coupled to the substrate 203 at a location between a first end 209a and a second end 209b thereby defining a first plate portion 211a and a second plate portion 211b. Accordingly, both of the first and second ends (209a, 209b) of the cantilever plate 209 can pivot around the torsion elements 230. This can be contrasted with the cantilever plate 105 of FIG. 3 and cantilever plate 205 of FIG. 4 which only pivot at a single end.

In operation, as MEMS magnetic field sensing component 350 is exposed to a magnetic field and a small bias current ($I_{BIAS}$) is applied to the conductor 37, the cantilever plate 209 may be deflected due to the resulting Lorentz force. More specifically, depending e.g., upon the routing of the conductor 37 and the corresponding direction of the bias current ($I_{BIAS}$), a first end 209a of the cantilever plate 209 may be deflected into the cavity 115 (e.g., into the page) due to the resulting Lorentz force 39a, while at the same time the second and opposite end 209b of the cantilever plate 209 is deflected away from the cavity 115 (e.g., out of the page) due to an opposing Lorentz force 39b. This deflection about the torsion elements 230 thus generates a bending and a twisting on the cantilever plate 209 in an area generally indicated by strain line 125. Moreover, because the Lorentz forces acting on cantilever plate 209 act in a complimentary manner where one enhances the other, the resulting sensitivity of the MEMS magnetic field sensing component 350 can be increased above that of MEMS magnetic field sensing component 200 or 300.

Figure 6:
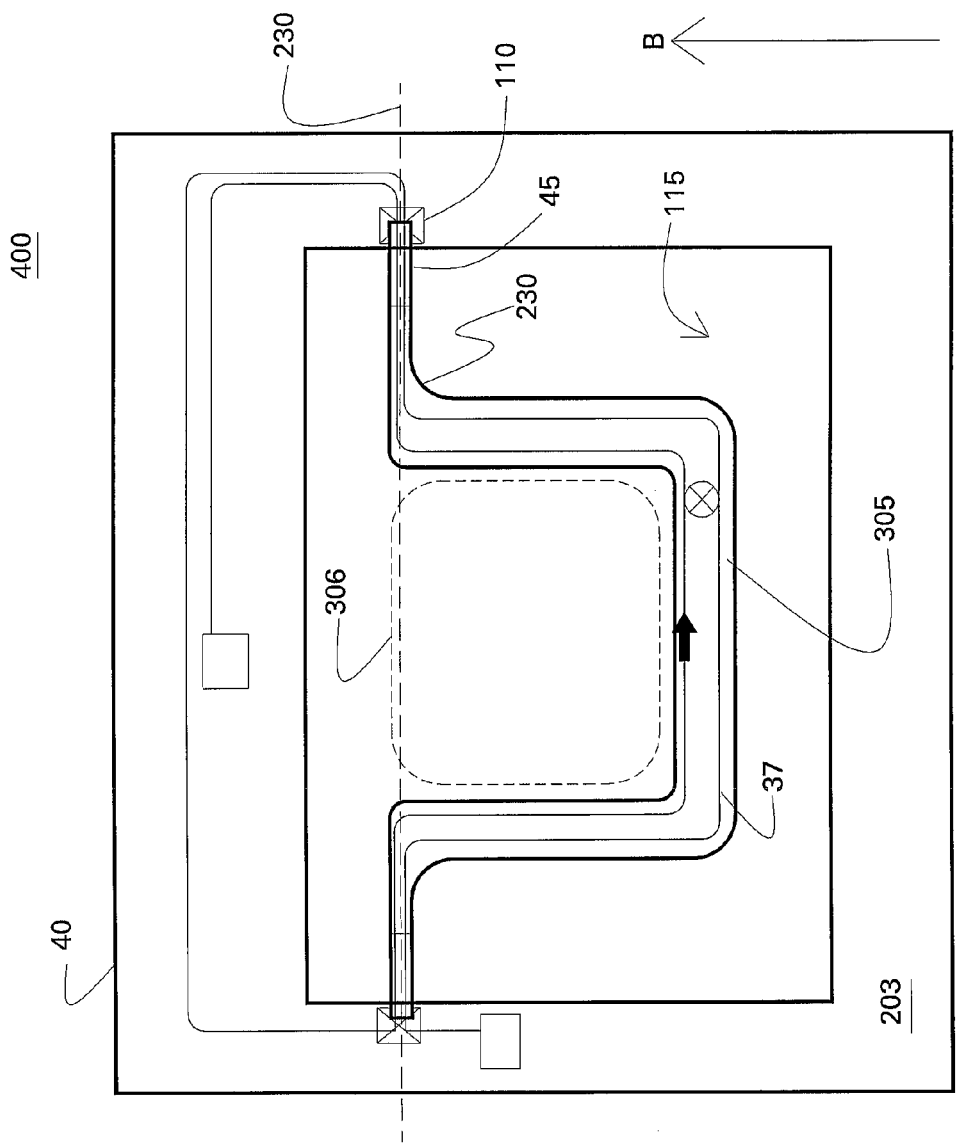
FIG. 6 illustrates an example MEMS magnetic field sensing component including a half-torsion U-shaped cantilever design in accordance with another embodiment of the invention.

FIG. 6 illustrates an example MEMS magnetic field sensing component including a half-torsion U-shaped cantilever design in accordance with another embodiment of the invention. As illustrated, MEMS magnetic field sensing component 400 includes a structural component 40 further including a substrate 203 and a cavity 115 defined therein. The MEMS magnetic field sensing component 400 further includes a cantilever plate 305 that is positioned above the cavity 115 as shown. The cantilever plate 305 is similar in form to the cantilever plate 205 of FIG. 4, except with cantilever plate 305 a substantial portion of the cantilever plate material (e.g., as indicated by section 306) is missing causing the cantilever plate 305 to be U-shaped as shown. In order to fabricate the cantilever plate 305, an otherwise whole cantilever plate first may be fabricated from which an amount of material approximating section 306 may be removed. Alternatively, a U-shaped cantilever plate such as that shown may be specifically fabricated absent section 306. Of course although not described herein other fabrication techniques may be possible.

As compared to a rectangular-shaped cantilever plate such as that shown in FIG. 3 and FIG. 4, the U-shaped cantilever plate 305 of FIG. 6 may provide additional sensitivity due at least in part to the U-shaped cantilever plate 305 being less stiff than corresponding rectangular cantilever plates. Additionally, due at least in part to its relatively small profile, U-shaped cantilever plate 305 also may be less susceptible to interfering measurands which can adversely effect the accuracy of the current sensor. Conversely, fabrication of the U-shaped cantilever plate 305 may be more challenging than that of the rectangular-shaped cantilever plate such as cantilever plate 105 or cantilever plate 205.

Figure 7:
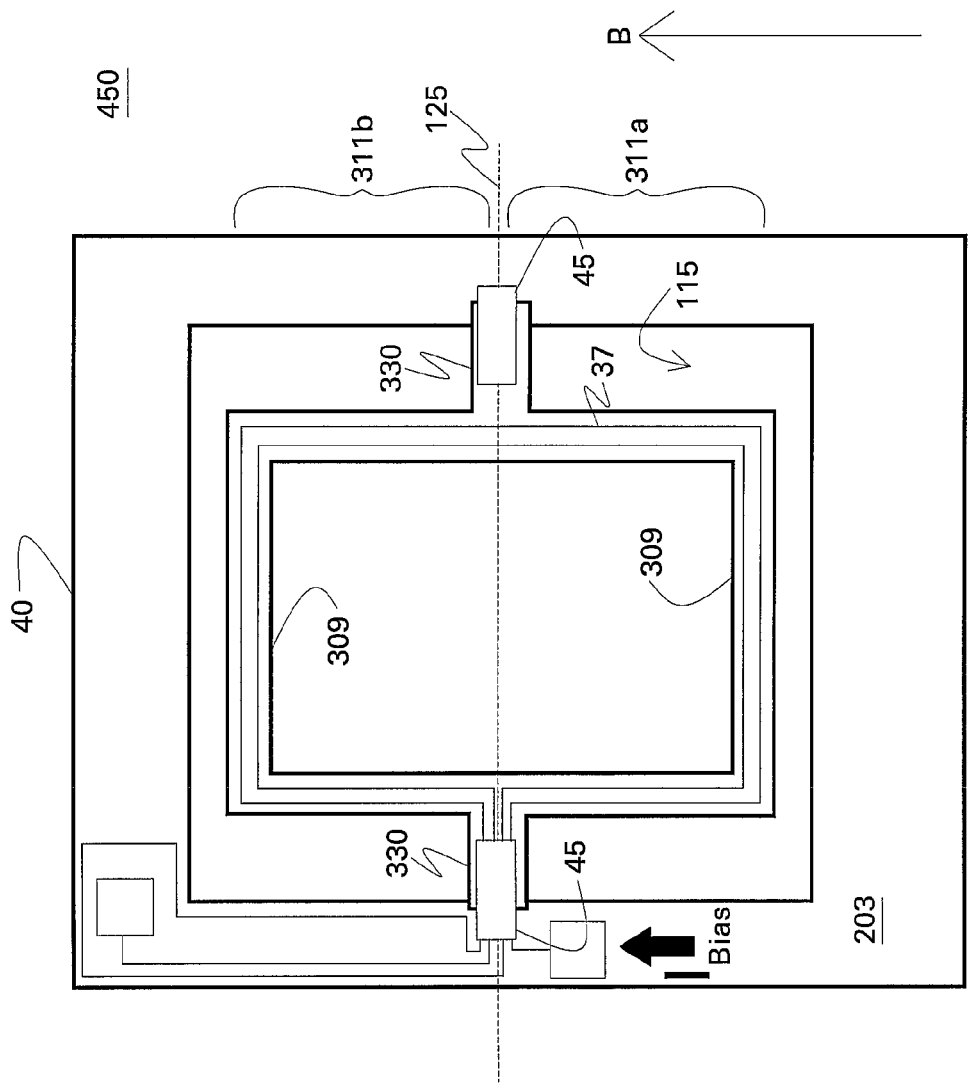
FIG. 7 illustrates an example MEMS magnetic field sensing component including a full-torsion U-shaped cantilever design in accordance with another embodiment of the invention.

FIG. 7 illustrates an example MEMS magnetic field sensing component including a full-torsion U-shaped cantilever design in accordance with another embodiment of the invention. MEMS magnetic field sensing component 450 includes aspects of both MEMS magnetic field sensing component 350 and MEMS magnetic field sensing component 400. That is to say, MEMS magnetic field sensing component 450 includes a U-shaped cantilever plate 309 that is coupled to the substrate 203 at a location between a first end 310a and a second end 310b so as to define a first plate portion 311a and a second plate portion 311b. Accordingly, both of the first and second ends (310a, 310b) of the cantilever plate 309 can pivot around the torsion elements 330 centered at a location generally indicated by strain line 125.

In accordance with one embodiment, the cantilever plate 309 may provide even further sensitivity over the previously described cantilever plates. More specifically, cantilever plate 309 shares the increased magnetic field sensitivity and decreased interference susceptibility of the U-shaped cantilever plate 305. Additionally, due to the full-torsion configuration, cantilever plate 309 may tend to be even more sensitive to magnetic field variations.

Figure 8:
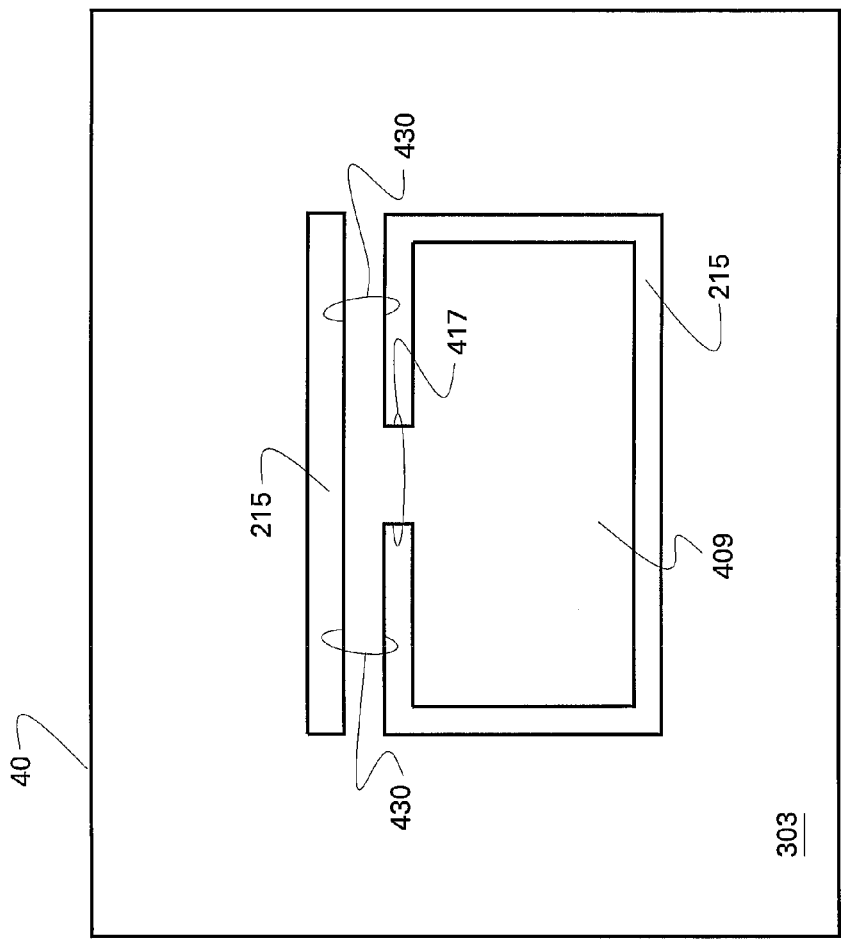
FIG. 8 illustrates an example MEMS magnetic field sensing component including a shutter-shaped cantilever design in accordance with yet another embodiment of the invention.

FIG. 8 illustrates an example MEMS magnetic field sensing component including a shutter-shaped cantilever design in accordance with yet another embodiment of the invention. MEMS magnetic field sensing component 500 includes a structural component 40, which further includes a substrate 303, and a cavity 215 defined within the substrate 303 so as to form the illustrated cantilever based spring element. In accordance with one embodiment, the illustrated spring element includes a cantilever plate 409, a torsion element 430 and a hinge element 417. As illustrated, the torsion element 430 may be positioned above the cavity 215 and connected to the substrate 303 on either side of the cavity 215. Additionally, the hinge element 417 may act to connect the torsion element 430 to the cantilever plate 409.

In operation, as MEMS magnetic field sensing component 500 is exposed to a magnetic field, and a small bias current (not shown) is applied to a conductor (not shown) coupled to the cantilever plate 409 for example, the cantilever plate 409 may be deflected into the cavity 215 due to the resulting Lorentz force. As a result, a bending induced strain may develop at least around the area of the hinge element 417 and a twisting induced strain or torsion may develop at least around the area of the torsion element 430. In one embodiment, both a bending induced strain and twisting induced strain may occur at either or both locations corresponding to the hinge element 417 and the torsion element 430. In accordance with one embodiment, one or more strain responsive components such as piezo-resistive elements may be adhered to the spring element to sense one or more of the bending and twisting generated strains.

Figure 9:
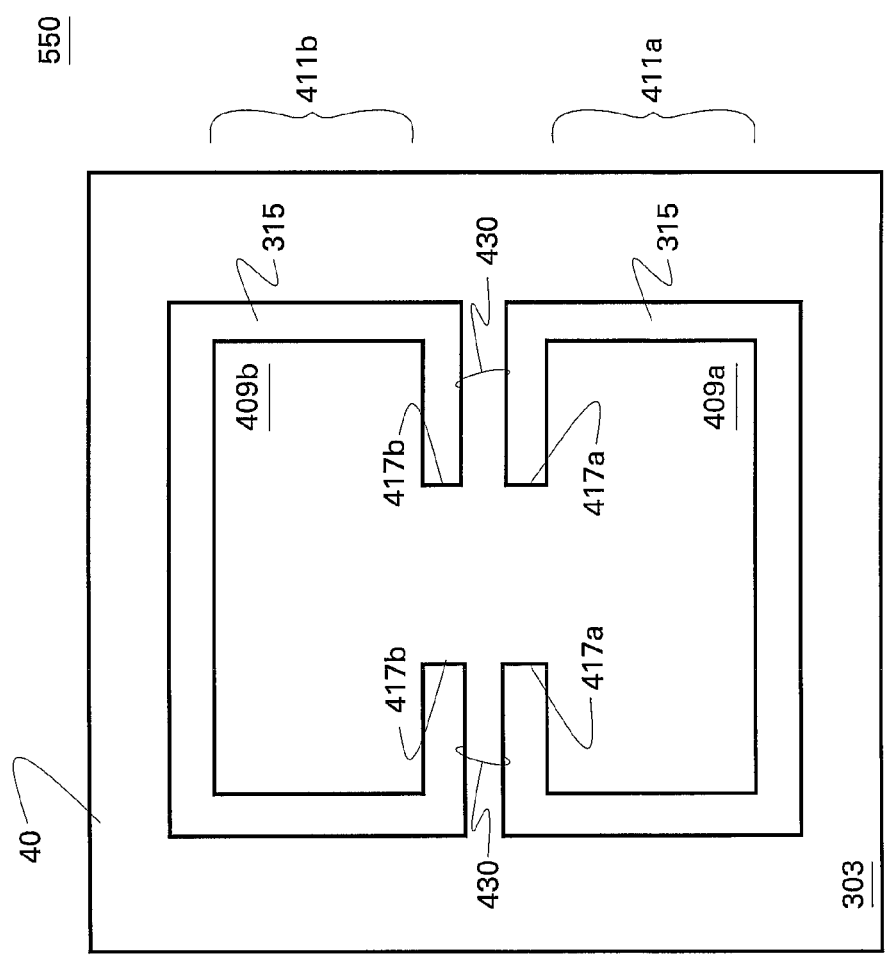
FIG. 9 illustrates an example MEMS magnetic field sensing component including a full-torsion shutter-shaped cantilever design in accordance with yet another embodiment of the invention.

FIG. 9 illustrates an example MEMS magnetic field sensing component including a full-torsion shutter-shaped cantilever design in accordance with yet another embodiment of the invention. MEMS magnetic field sensing component 550 includes a structural component 40, which further includes a substrate 303, and a cavity 315 defined within the substrate 303 so as to form the illustrated full-torsion cantilever based spring element. In accordance with the illustrated embodiment, the spring element includes a first cantilever plate 409a, and a second cantilever plate 409b coupled to a torsion element 430 by hinge elements 417a and 417b respectively. More specifically, the first cantilever plate 409a is coupled to the torsion element 430 by a first hinge element 417a and the second cantilever plate 409a is coupled to the torsion element 430 by a second hinge element 417b. As illustrated, the torsion element 430 may be positioned above the cavity 315 and coupled to or integral with the substrate 303 on either side of the cavity 315. Additionally, strain responsive components 45 may be positioned at various locations on and around the spring element to register both a bending induced strain (e.g., around the area of the hinge elements 417a, 417b) and a twisting induced strain or torsion around (e.g., around the area of the torsion element 430).

Figure 10:
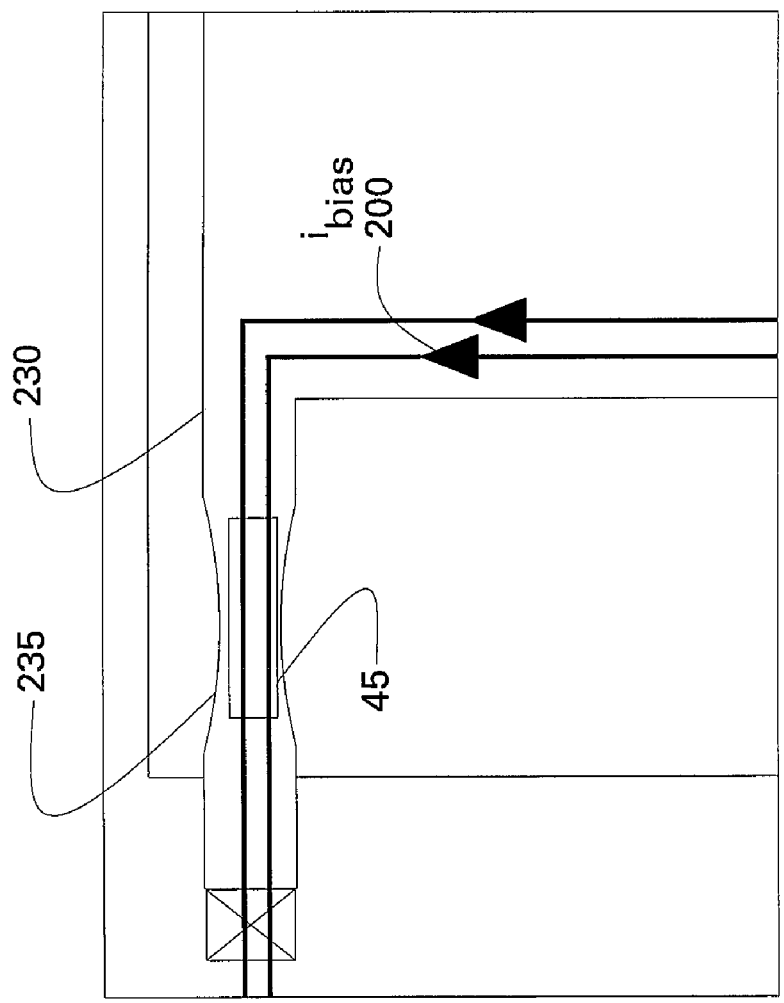
FIG. 10 illustrates one embodiment of a strain concentrator suitable for use with one or more spring elements described herein.

FIG. 10 illustrates one embodiment of a strain concentrator suitable for use with one or more spring elements described herein. The strain concentrator 235 may be a geometric or material based modification made to one or more torsion elements 230 to focus or otherwise redirect the strain resulting from displacement of a spring element such as a cantilever. In the illustrated embodiment of FIG. 10 for example, the strain concentrator 235 is represented by a narrowing of the torsion element 230. Such narrowing acts to focus strain developed in torsion element 230 to an area localized or more concentrated around the strain responsive component 45.

Alternatively, torsion element 230 could be modified through physical or modification of its material properties.

Figure 11:
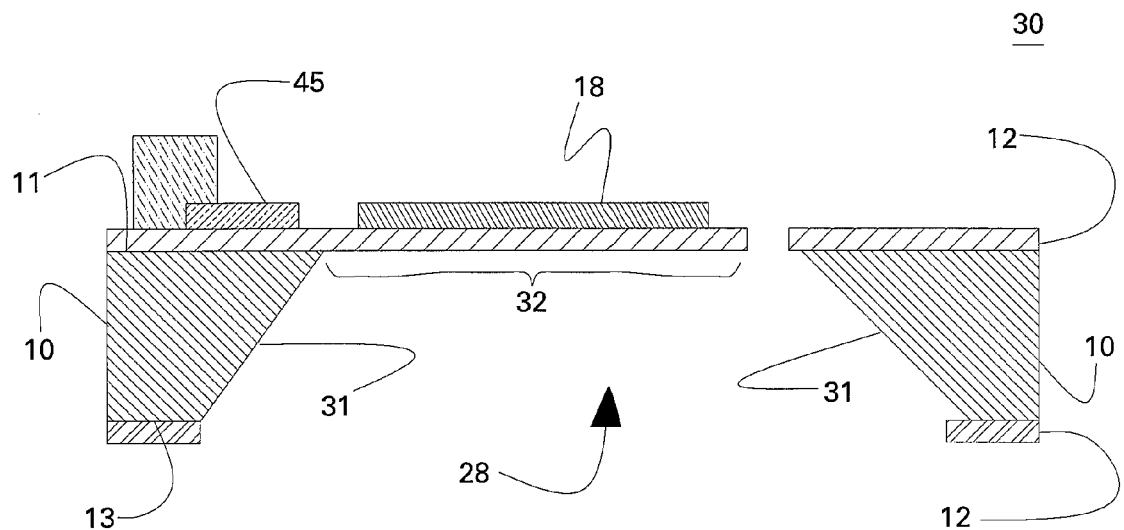
FIG. 11 is a schematic sectional side view illustrating aspects of a MEMS magnetic field sensing component in accordance with one embodiment of the present invention.

FIG. 11 is a schematic sectional side view illustrating aspects of a MEMS magnetic field sensing component in accordance with one embodiment. In the illustrated embodiment, magneto-MEMS component 30 is shown including a substrate 10 having an upper side 11 and a lower side 13. In one embodiment, the substrate may be a silicon substrate. In one embodiment, the substrate may be a silicon wafer having a thickness of about 300 μm. Formed through a portion of the lower side 13 of the substrate 10 is a cavity 28 having walls 31 extending to the upper side 11. A spring element such as, but not limited to a cantilever or membrane is formed on the upper side of the substrate 10 and at least partially above the cavity 28. For the purposes of the following description, the spring element 32 is illustrated and described as being a cantilever (e.g., cantilever 32). This however, is for convenience and is not intended to limit the disclosure in any way.

In one embodiment, the substrate 10 may be coated on both the upper side 11 and the lower side 13 with a compliant layer 12. In one embodiment, the compliant layer 12 may be low stress silicon, silicon nitride, or a silicon dioxide layer. In other embodiments the compliant layer 12 may include materials such as crystalline silicon nitride and/or polymers. As used herein and unless otherwise qualified, the term "low stress silicon" is intended to refer to silicon and silicon compositions having a residual stress of less than about 100 MPa.

In one embodiment, the thickness of the compliant layer 12 may be about 5000 Angstroms but may range from about 1000 Angstroms to about 10,000 Angstroms. In a further embodiment, the compliant layer 12 may include a first relatively thin layer of stoichiometrically balanced silicon nitride of formula $Si_3N_4$ (hereinafter referred to as "stoichiometric silicon nitride"), and a second layer of relatively low stress non-stoichiometrically balanced silicon nitride (hereinafter referred to as "low stress silicon nitride"). In one embodiment, the stoichiometric silicon nitride may be of formula $Si_3N_4$ and may have a thickness of about 300 to about 500 Angstroms. In contrast, the low stress silicon nitride may be represented by formula $Si_xN_y$, where the ratio x:y is representative of the properties of the material, and where this ratio of x to y is relatively close to unity. In particular, and in some embodiments, x may be taken as x=1 without any loss of generality, and y may range from about 0.75 to about 1 (e.g., 0.75, 0.8, 0.9, 1). In one embodiment, the low stress silicon nitride layer may have a thickness on the order of about ten times that of the stoichiometric silicon nitride and may have a residual stress of less than about 100 mega pascals.

Due at least in part to the use of the low stress silicon nitride, it is possible to decrease the thickness and thereby increase the responsiveness of the spring element (e.g. cantilever 32) over conventional techniques. In one embodiment, the stoichiometric silicon nitride may be deposited between the substrate 10 and the low stress silicon nitride layer (shown together as compliant layer 12). Accordingly, the stoichiometric silicon nitride may act to decrease potential delamination between the low stress silicon nitride and the substrate 10 that may result as a side effect of an annealing process.

A magnetic-to-mechanical converter in the form of a conductor 18 for carrying current is further arranged at least partially over the cantilever 32 and the cavity 28. The conductor 18 may comprise a variety of electrically conductive materials including but not limited to Titanium, Tungsten, Gold, Aluminum, Platinum, Palladium, Copper, Chromium, doped polysilicon, doped silicon, SiC, GaN and so forth. In one embodiment, the cantilever 32 comprises silicon nitride, however, the cantilever may instead comprise polymers, polysilicon, silicon, oxide, oxinitride, silicon dioxide and so forth.

Figure 13:
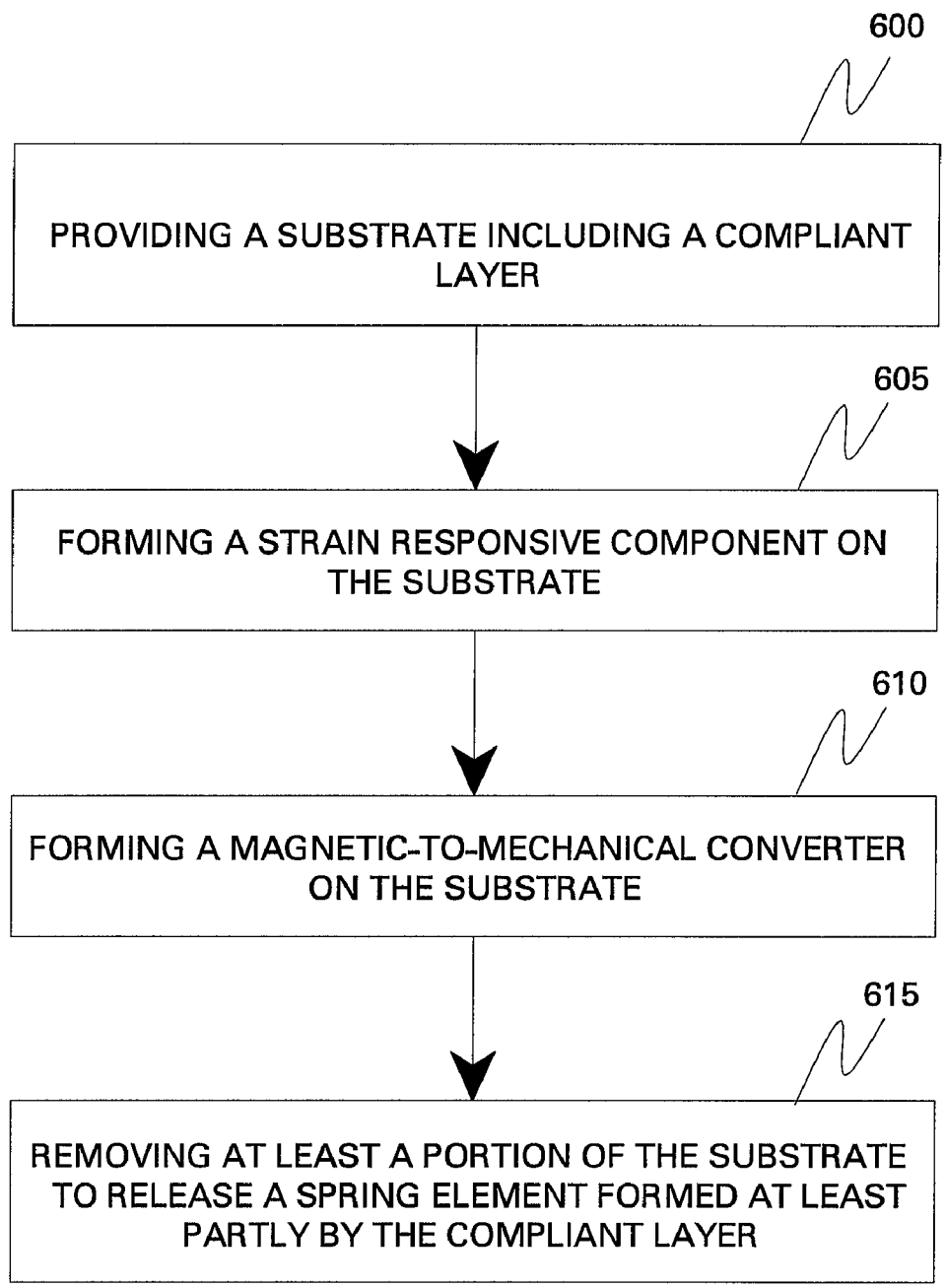
FIG. 13 is a flow diagram illustrating an example fabrication method for one embodiment of a MEMS magnetic field sensing component such as illustrated in FIG. 11.

FIG. 13 is a flow diagram illustrating an example fabrication method for one embodiment of a MEMS magnetic field sensing component such as illustrated in FIG. 11. The specific processing conditions and dimensions described herein serve to illustrate one specific fabrication method but can be varied depending upon the materials used and the desired application and geometry of the MEMS current and magnetic field sensor.

The fabrication method may begin at block 600 with provision of a substrate 10 including a compliant layer. In one embodiment, the compliant layer may be low stress silicon layer comprised of silicon, silicon nitride, or silicon dioxide. In one embodiment, the residual stress of a low stress silicon layer is less than 100 MPa. In one embodiment, the substrate 10 may be a silicon substrate, however other materials having similar properties may be used. In an alternative embodiment, the fabrication method may begin with the provision of a substrate 10, which is in turn then coated with a low stress silicon layer. In either case, and in accordance with one embodiment of the present invention, the low stress silicon layer may be silicon nitride or silicon dioxide. However, as previously described, the low stress silicon layer may include a first relatively thin layer of stoichiometrically balanced silicon nitride and a second layer of relatively low stress non-stoichiometrically balanced silicon nitride.

At block 605, a strain responsive component is formed on the substrate. In one embodiment, this may involve a blanket coating (e.g., a coating having a substantially consistent depth or thickness) of amorphous polysilicon. The polysilicon may then be doped (e.g. through ion implantation) to form strain responsive components in the form of P-type piezo resistive elements. In one embodiment, the polysilicon may be lightly doped with Boron at a dose of 2.5E+15 atoms/(cm)2. The substrate may then be coated with a photolithographic etch resist compound in a pattern corresponding to locations where the piezo resistive elements (and optionally where conductors and/or contact pads) are to be located. Once the substrate is exposed and the etch-resist is developed the exposed areas of the polysilicon may be etched away. Next, the substrate may be annealed for between about 30 and 60 minutes at a temperature between about 800° C. and 1050° C.

At block 610, one or more magnetic-to mechanical converters in the form e.g. of a conductor may be formed. The conductors (in addition to contact pads) may be formed through additional doping of the polysilicon or through the coating of metal on the substrate. In one embodiment, areas of the polysilicon that are to be made into conductors or contact pads may be more heavily doped with Boron at a dose of 1.0E+16 atoms/(cm)2. In an alternative embodiment, a coating of an electrically conductive metal such as gold may be deposited on the substrate. The metal may be coated through e.g., sputter or evaporative techniques known to those possessing ordinary skill in the art of photolithography. In one embodiment, an adhesion layer may be deposited on the substrate before the metal deposition process. The adhesion layer may be used such that the metal better adheres to the underlying material whether it be polysilicon or nitride. In one embodiment, the adhesion layer is formed of elemental chromium, however in other embodiments, compounds such as Ti—W may be used. Once the adhesion layer and the metal have been deposited, a coating of etch resist may be applied and the substrate may be masked, exposed and developed to form the conductors and pads. Thereafter, the metal and adhesion layers may be removed through e.g., an etch process.

At block 615, a portion of the substrate is removed to release the spring element. In one embodiment, an additional layer of silicon nitride may first be deposited (e.g. to a depth of about 1 μm) over the upper side of the substrate using for example, a low pressure chemical vapor deposition. Certain areas of the silicon nitride overcoat may then be exposed through e.g. the process of reactive ion etching. This allows contact pads to be exposed for the purpose of external connection and allows the cantilever plate to be released from the remainder of the compliant. In the event the spring element is a membrane, the compliant layer would not be released from the remainder of the compliant layer. In one embodiment, an anisotropic etch process (e.g., a KOH etch process) may further be performed through the bottom side 13 of the silicon substrate 10 to form the cavity 28, the angled walls 31 and finally cantilever plate 32.

As disclosed herein, the need to physically contact a first current carrying conductor 4 to sense the current I is obviated. It is also noted that due to the small dimensions of micromachined MEMS devices, the MEMS-based current sensor 100 is itself a dimensionally small device. Accordingly, the change in the magnetic field being sensed by the MEMS-based current sensor 100 at various points on the sensor is very small. The MEMS-based current sensor 100 is therefore accurate since there is no need to compensate for variances across the measuring sensor itself.

Due at least in part to the use of MEMS technology, the magnetic forces required to operate the MEMS devices are relatively small. The current sensor hereof thus tends to generate relatively little heat. This is advantageous in that there is little heat generated by the current sensors herein that may introduce an error in the sensing of the current I.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A micro-electromechanical system current and magnetic field sensor for sensing a magnetic field produced by a current carrying conductor, comprising:
   a structural component comprising a substrate and a compliant layer;
   a magnetic-to-mechanical converter coupled to the structural component to provide a mechanical indication of the magnetic field; and
   a strain responsive component coupled to the structural component to sense the mechanical indication and to provide an indication of the current in the current carrying conductor in response thereto.

2. The micro-electromechanical system of claim 1, wherein the substrate comprises silicon.

3. The micro-electromechanical system of claim 2, wherein the compliant layer comprises silicon dioxide or silicon nitride.

4. The micro-electromechanical system of claim 1, wherein the compliant layer comprises at least one low stress silicon layer having a residual stress of less than about 100 mega pascals.

5. The micro-electromechanical system current and magnetic field sensor of claim 4, wherein the low stress silicon layer comprises a first silicon nitride layer.

6. The micro-electromechanical system current and magnetic field sensor of claim 5, wherein the low stress silicon region layer comprises a second silicon nitride layer of formula SixNy where the ratio x:y is less than or equal to 1.

7. The micro-electromechanical system current and magnetic field sensor of claim 1, wherein the strain responsive component comprises a piezo resistive element.

8. The micro-electromechanical system current and magnetic field sensor of claim 1, wherein the structural component comprises a spring element selected from the group consisting of a cantilever, a deflectable membrane, a torsion element and combinations thereof.

9. The micro-electromechanical system current and magnetic field sensor of claim 1, wherein the structural component is configured to register a bending action responsive to the mechanical indication from the magnetic-to-mechanical converter.

10. A micro-electromechanical system current and magnetic field sensor for sensing a magnetic field produced by a current carrying conductor, comprising:
    a structural component configured to register a bending action and a twisting action responsive to a mechanical indication from a magnetic-to-mechanical converter;
    the magnetic-to-mechanical converter coupled to the structural component to provide the mechanical indication of the magnetic field; and
    a strain responsive component coupled to the structural component to sense the mechanical indication and to provide an indication of the current in the current carrying conductor in response thereto.

11. The micro-electromechanical system of claim 10, wherein the structural component comprises a silicon substrate.

12. The micro-electromechanical system of claim 10, wherein the structural component further comprises a silicon dioxide or silicon nitride region.

13. The micro-electromechanical system current and magnetic field sensor of claim 10, wherein the structural component comprises:
    a first spring element; and
    a torsion element coupled to the first spring element, wherein the first spring element is displaced about the torsion element responsive to the mechanical indication to concurrently effect the bending action and the twisting action.

14. The micro-electromechanical system current and magnetic field sensor of claim 13, further comprising a hinge element coupled between the first spring element and the torsion element such that as the first spring element is displaced responsive to the mechanical indication, the bending action is registered by the hinge element and the twisting action is concurrently registered by the torsion element.

15. The micro-electromechanical system current and magnetic field sensor of claim 14, wherein the strain responsive component comprises a piezo resistive device coupled to the torsion element.

16. The micro-electromechanical system current and magnetic field sensor of claim 10, wherein the structural component comprises:
    a spring element having a first end configured to experience a first stress responsive to the mechanical indication and a second end configured to receive a second stress responsive to the mechanical indication, wherein the second stress is substantially opposite in direction to the first stress; and a torsion element coupled to the spring element and about which the first and second ends of the spring element are displaced in response to the first and second stresses, wherein the torsion element is configured to register at least the twisting action.

17. The micro-electromechanical system current and magnetic field sensor of claim 16, further comprising a first hinge element coupled between the first end of the spring element and the torsion element and a second hinge element coupled between the second end of the spring element and the torsion element.

18. The micro-electromechanical system current and magnetic field sensor of claim 17, wherein the strain responsive component comprises at least one piezo resistive device coupled to the torsion element.

19. A micro-electromechanical system current and magnetic field sensor for sensing a magnetic field produced by a current carrying conductor, comprising:

a structural component comprising a region of low-stress silicon;

a magnetic-to-mechanical converter coupled to the structural component to provide a mechanical indication of the magnetic field; and a strain responsive component coupled to the structural component to sense the mechanical indication and to provide an indication of the current in the current carrying conductor in response thereto.

20. The micro-electromechanical system of claim 19, wherein the low-stress silicon comprises a residual stress of less than about 100 mega pascals.

21. A method for fabricating a micro-electromechanical system magnetic field sensing component comprising:

providing a substrate including a compliant layer comprising silicon dioxide or silicon nitride;

forming a strain responsive component on the substrate;

forming a magnetic-to-mechanical converter on the substrate; and removing at least a portion of the substrate to release a spring element formed at least partly by the compliant layer.

22. The method of claim 21, wherein forming a strain responsive component on the substrate comprises:

depositing a layer of amorphous polysilicon on an upper side of the substrate; and doping the polysilicon to create a piezo resistive element out of the polysilicon.

* * * * *